United States Patent [19]

Turnbull

[11] Patent Number: 5,079,420
[45] Date of Patent: Jan. 7, 1992

[54] PYROELECTRIC AND OTHER THERMAL-RADIATION DETECTORS WITH FILM ELEMENT(S)

[75] Inventor: Andrew A. Turnbull, Reigate, England

[73] Assignee: U.S. Philips Corp., New York, N.Y.

[21] Appl. No.: 581,830,

[22] Filed: Sep. 12, 1990

[30] Foreign Application Priority Data

Sep. 13, 1989 [GB] United Kingdom ............... 8920678

[51] Int. Cl.[5] ............................................. G01J 5/10
[52] U.S. Cl. ................................. 250/338.3; 250/349
[58] Field of Search .................. 250/338.3, 338.1, 349, 250/332

[56] References Cited

U.S. PATENT DOCUMENTS 4,060,729 11/1977 Byer et al. ...................... 250/338.3
4,425,502 1/1984 Hall et al. ........................ 250/338.3
4,691,104 9/1987 Murata et al. ................... 250/338.3

*Primary Examiner*—Carolyn E. Fields
*Assistant Examiner*—James E. Beyer
*Attorney, Agent, or Firm*—William L. Botjer

[57] ABSTRACT

An infrared detector element (20) comprises a flexible continuous film (10) of polymer material which has pyroelectric or other temperature-dependent characteristics and which is also piezoelectric so also generating microphony when it vibrates. In accordance with the invention the mounting arrangement (30,31,32) for the film (10) comprises mutually-spaced supports (32), e.g. tapered ridges (32) of a moulded-plastics substrate (30); the spacing (x) between neighboring supports (32) adjacent to the detector element (20) is sufficiently small and the tension (P) of the film (10) is sufficiently large that the natural frequency of vibration of the parts of the polymer film (10) between these neighboring supports (32) is higher than the frequency bandwidth of the detector, e.g. as determined by the highest operating frequency of a read-out circuit to which the detector element (20) is connected. This arrangement significantly reduces the effects of microphony in contributing to the electrical output of the detector. The ridge portions (32) may form a continuous network around cavities (35) below the detector elements (20), and a conduit may extend into each cavity (35) to equalize the ambient pressure inside each cavity with that at the opposite face (12) of the polymer film (10).

12 Claims, 2 Drawing Sheets

PYROELECTRIC AND OTHER THERMAL-RADIATION DETECTORS WITH FILM ELEMENT(S)

BACKGROUND OF THE INVENTION

This invention relates to thermal-radiation detectors comprising a polymer film having a temperature-dependent characteristic to provide one or more infrared detector elements. The detector may comprise, for example, a linear array or 2-dimensional array of detector elements having pyroelectric and/or ferroelectric properties and may be used in, for example, an inexpensive infrared camera or other infrared imaging equipment.

Published European patent application EP-A-0 269 161 describes an example of a thermal-radiation detector comprising an infrared detector element or a group of infrared detector elements having first and second electrodes at respective first and second opposite faces of a flexible continuous film of polymer material having a temperature-dependent characteristic (pyroelectric in this case); the polymer material also has piezoelectric properties; and the polymer film is secured to a mounting arrangement to maintain the film taut. In the type of detector structure described in EP-A-0 269 161, the polymer film of, for example, a vinylidene fluoride copolymer is a quarter-wavelength thick to optimise radiation absorption with suitably resistive electrodes. The film is taut but not stretched, and the mounting arrangement comprises an electrically insulative annulus mounted on the header of the detector envelope. The periphery of the polymer film is bonded to the annulus so that the area of the detector element(s) is supported spaced from the header; hence this area of the second face of the film is free of contact with the mounting arrangement. This mounting arrangement reduces thermal conduction to and from the detector element(s). The whole contents of EP-A-0 269 161 are hereby incorporated herein as reference material.

In general, pyroelectric and ferroelectric materials are also piezoelectric. Hence the detector elements also produce electrical output if subjected to varying stress (for example by vibration and/or shock). This phenomenon, termed microphony, constitutes undesired background noise which interferes with the detection of the thermal radiation. This microphonic background noise forms part of the signal output from the detector elements to an electronic read-out circuit, and separation of this background noise from the infrared-generated signal component cannot be readily achieved in the read-out circuit.

SUMMARY OF THE INVENTION

According to one aspect of the present invention there is provided a thermal-radiation detector comprising a flexible continuous film of polymer material having a temperature-dependent characteristic to provide an infrared detector element, which polymer material also has piezoelectric properties, and a mounting arrangement to which the polymer film is secured to maintain the polymer film taut, characterised in that the mounting arrangement comprises mutually-spaced supports which contact a first face of the polymer film and on which the film is held under tension, and in that the spacing between neighbouring supports adjacent to the detector element is sufficiently small and the tension of the film is sufficiently large that the natural frequency of vibration of the part of the polymer film between these neighbouring supports is higher than the frequency bandwidth of the detector.

According to another aspect of the present invention there is provided a thermal-radiation detector comprising a group of infrared detector elements having first and second electrodes at respective first and second opposite faces of a flexible continuous film of polymer material having a temperature-dependent characteristic, which polymer material also has piezoelectric properties, and a mounting arrangement to which the polymer film is secured to maintain the polymer film taut, which detector is characterised in that the mounting arrangement comprises a plurality of mutually-spaced supports which contact the first face of the polymer film to reduce flexing of the polymer film, the film being held under tension on the spaced supports, the mounting arrangement has cavities between the spaced supports such that where the detector elements are present at least most of the area of said first face of the polymer film is free of contact with the mounting arrangement, and the spacing between neighbouring supports adjacent to the detector elements is sufficiently small and the tension of the film is sufficiently large that the natural frequency of vibration of the parts of the polymer film between these neighbouring supports is higher than the frequency bandwidth of the detector.

The adoption of such a construction for the detector is based on a recognition by the present inventor that the effects of microphony in contributing to the electrical output of the detector (especially with resonant vibration of the film) can be significantly reduced by arranging the support and tension of the film in such a manner as to increase the natural frequency of vibration of the relevant parts of the film to a value outside the frequency bandwidth of the detector. Thus, the electrical output which is generated piezoelectrically in the detector elements at this high frequency can be avoided in the final electrical output from the detector. In general, the natural frequency of vibration for a given thickness and tension of the film increases with closer spacing of the supports, and the amplitude of vibration decreases (both at resonant frequencies and other frequencies) as the spacing of the supports becomes closer and/or the film tension is increased. Thus, by a suitable choice of spacing and tension, the microphonic output from the piezoelectric film can be reduced both at resonant frequencies and at non-resonant frequencies. Examples will be described later, illustrating the effect of varying these parameters and those which determine the upper limit of the bandwidth of the detector.

By nevertheless arranging that, where the detector elements are present, most of the area of the first face of the polymer film remains free of contact with the mounting arrangement a low thermal conductance to and from the detector elements can be maintained. For this reason, it is also beneficial, when the detector elements comprise a group of individual first electrodes at the first face of the polymer film, that these first electrodes are located over the cavities and that the supports contact said first face of the film at areas which are between the first electrodes and which preferably are separated from the first electrodes by at least a thermal-diffusion distance for heat flow along the polymer film.

It may be noted that it is already known to support a pyroelectric layer (e.g. a polymer such as polyvinylidene fluoride) on a substrate having cavities at the areas of the detector elements so as to reduce heat flow. Such an arrangement is described in U.S. Pat. specification No. US-A-4 532 424; the pyroelectric layer has openings through it to define the areas of each detector element and to reduce heat flow along the layer, and so this layer is not continuous and is not tensioned. In order to provide good support for this delicate layer, the substrate has large surface areas of contact with the detector element layer. The substrate in the detector of US-A-4 532 424 carries a common ground electrode at its contact surfaces and is bonded to a common electrode layer on one side of the pyroelectric layer. The openings in the film extend also in this common electrode layer to reduce heat flow along the electrode layer.

The supports and cavities of the mounting arrangement in accordance with the present invention may be formed in a variety of ways with various materials. Thus, for example, the supports may be formed by material-deposition on a substrate, and/or by etching, and/or by machining and/or by cutting in some other manner. A good physically compatible arrangement for mounting the polymer film can be provided in a comparatively inexpensive manner by forming at least the part providing the supports and cavities of moulded plastics material, for example by a replication process The plastics material can have thermal expansion properties comparable to those of the film, and the very smooth edges of the supports can be formed by moulding. Thus, in one particular example, both the film of polymer material and said moulded plastics material of the mounting arrangement may comprise polyvinylidene fluoride. The supports may taper towards the polymer film to form a narrow upper edge which contacts said one face of the polymer film. In this manner the contact area between the film and supports can be reduced, so reducing heat conduction to and from the film. Good control of the natural frequency of vibration of the film can be obtained by using tapering ridge portions of a mount, between neighbouring cavities in the mount to form the mutually-spaced supports. These cavities may be open at their ends, or, for example, the ridge portions may form a continuous network around the cavities. Thus the tensioned film may have a cellular support. In order to avoid totally closed cell cavities. Apertures may extend through the mounting arrangement and into the cavities to provide a conduit permitting ambient pressure inside each cavity to equalize the ambient pressure at the opposite face of the polymer film.

BRIEF DESCRIPTION OF THE DRAWING

These and other features in accordance with the the invention are illustrated specifically in embodiments of the invention now to be described, by way of example, with reference to the accompanying diagrammatic drawings. In the drawings:

It should be noted that all the drawings are diagrammatic. FIGS. 1 to 4 and FIG. 6 are not drawn to scale, but relative dimensions and proportions of parts of these Figures have been shown exaggerated or reduced in size for the sake of clarity and convenience in the drawings. The same reference signs as used in one embodiment are generally used for referring to corresponding or simi ar parts in other embodiments.

DETAILED DESCRIPTION OF PREFERRED EMBODIMENTS

Figure 1:
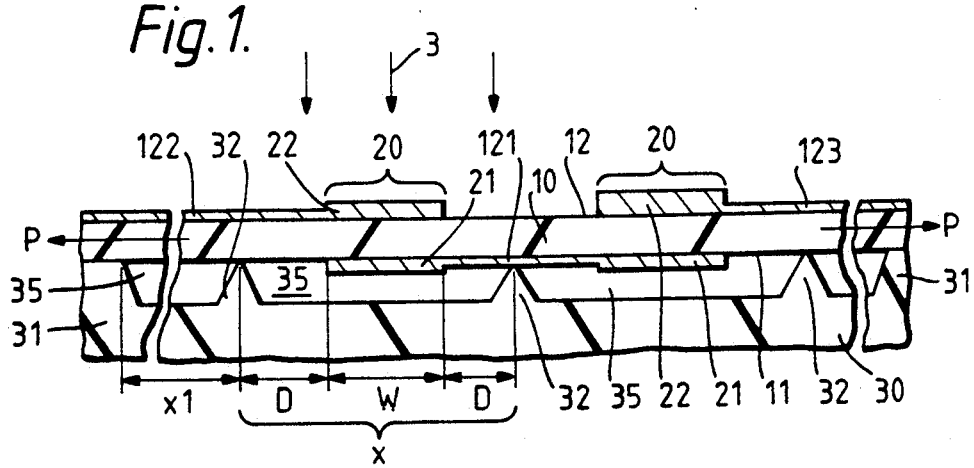
FIG. 1 is a cross sectional view of part of an array of a thermal-radiation detector in accordance with the invention.

FIG. 1 illustrates part of a thermal-radiation detector, comprising a group of infrared detector elements 20 having first and second electrodes 21 and 22 at respective first and second opposite faces 11 and 12 of a flexible continuous film 10 of polymer material. The film material has a temperature-dependent characteristic for detection of infrared radiation 3 and also has piezoelectric properties. The polymer film 10 is secured to a mounting arrangement 30,31,32 to maintain the polymer film taut.

In accordance with the present invention the mounting arrangement 30,31,32 comprises a plurality of mutually-spaced supports 32 which contact the first face of the polymer film 10 to reduce flexing of the polymer film 10; the film 10 is held under tension P on the spaced supports 32; the mounting arrangement 30,31,32 has cavities 35 between the spaced supports 32 such that, where the group of elements 20 is present, at least most of the area of the first face of the polymer film 10 is free of contact with the mounting arrangement 30,31,32; and the spacing x between neighbouring supports 32 adjacent to the detector elements 20 is sufficiently small and the tension P of the film 10 is sufficiently large that the natural frequency of vibration $v$ of the parts of the polymer film 10 between these neighbouring supports 32 is higher than the frequency bandwidth (of to ii) oi the detector.

Figure 2:
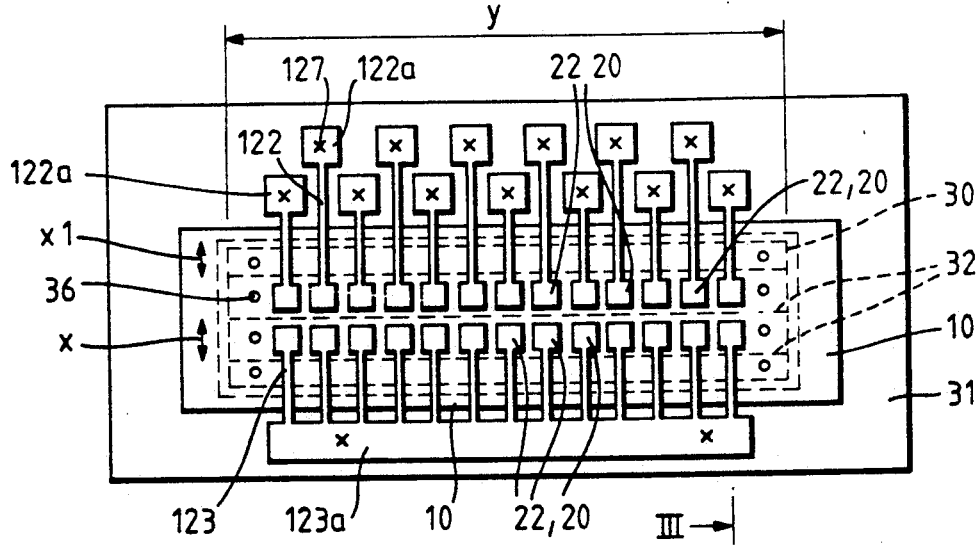
FIG. 2 is a plan view of one form of the infrared-sensing array device of such a thermal-radiation detector in accordance with the invention.
Figure 3:
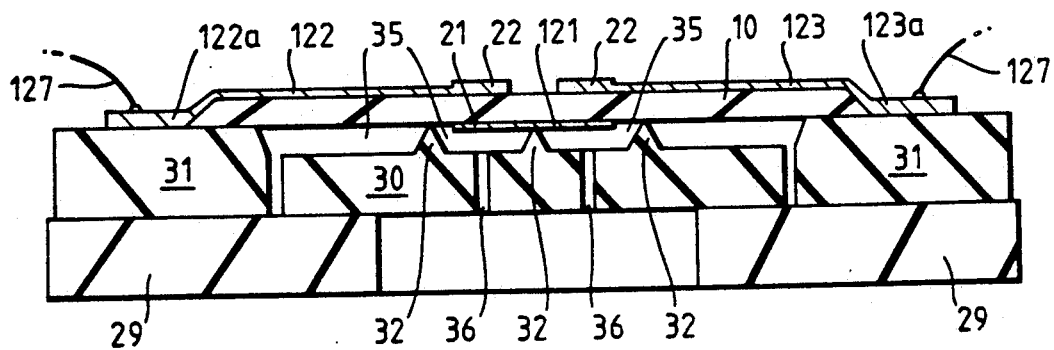
FIG. 3 is a cross-sectional view of such an array device, taken on the line III—III of FIG. 2.

The detector array of FIG. 1 may be of the form illustrated in FIGS. 2 and 3 having, by way of example, two rows of detector elements 20 formed back-to-back. Only thirteen detector elements are shown in each row in FIG. 2, but it should be understood that in a typical thermal-image detector each row may comprise a linear array of many more, for example 64 or 128 detector elements 20. Each row may be made up of active detector elements; however in the form illustrated in FIG. 2 the upper element 20 in each pair of back-to-back elements 20 is an active detecting element, whereas the lower element 20 is a compensating element to provide signal compensation in known manner for effects of ambient temperature changes and microphony on the active elements The elements 20 can be constructed in known manner. Thus the polymer film 10 may be. For example, about one quarter of a wavelength in its optical thickness, in accordance with the teaching in EP-A-0 269 161. In a typical case of an array of pyroelectric detector elements 20 for infrared detection in the wavelength range of about 5 to 15 micrometers, the film 10 may be, for example, between 1.5 and 2 micrometers thick. The film 10 may consist of. For example. a vinylidene fluoride polymer such as a vinylidene fluoride trifluoroethylene copolymer material which has been poled in a conventional manner to orient approximately its dipoles such that it exhibits satisfactory pyroelectric properties. Other polymer materials exhibiting pyroelectric properties may be used instead to form the film 10, as described in EP-A-0 269 161. In the arrangement illustrated in FIGS. 1 and 2, the electrodes 21 and 22 are supported solely by the film 10 and are located away from supported areas of the film 10.

The first and second electrodes 21 and 22 of each detector element 20 (overlying and substantially coextensive with one another) serve to define the lateral extent of the actual detector element 20 as well as providing its electrical connections. The electrodes 22 facing the incoming radiation 3 may comprise nickel/chromium alloy disposed directly on the surface 12 of the film 10 by sputtering or evaporation to a thickness of less an 0.1 $\mu$m. The electrode layer 22 of the active detector elements 20 has a substantial effective resistance per square so as to ensure the layer absorbs a substantial proportion of incident radiation 3 in the wavelength range of interest, for example 5 $\mu$m to 15 $\mu$m. In the case of the compensating elements 20, the nickel/chromium alloy may be coated with a gold layer to provide a low resistance per square so that their electrodes 22 facing the incoming radiation 3 may be reflective. Alternatively, the detector array may be mounted in the detector envelope in such a way that the compensating elements 20 are shielded from the incoming radiation 3 or in such a way that the radiation 3 is not focussed on the compensating elements 20.

The opposite electrode layer 21 of the elements 20 faces the mounting arrangement 30,31,32 and may be made reflective so as to reflect back towards the electrode layer 22 any radiation 3 in the wavelength range of interest passing through the film 10. For this purpose, the electrode layer 21 may comprise a nickel/chromium "seed" layer disposed directly on the film 10 and coated with a gold layer. It is considered that for a reflecting electrode layer 21, a resistance per square adjacent the film 10 of the order of 5 ohms or less should be adequately low. However as will be described hereinafter, the electrode layer 21 may be made resistive so as to be absorbing and not reflective, and an underlying surface of the mounting arrangement 30,31,32 may be reflective so as to reflect back to the resistive electrodes 21 and 22 any radiation 3 which passes through the detector element 20.

By way of illustration, FIGS. 1 to 3 show one example of how pairs of active detecting elements and compensating elements may be connected in the back-to-back linear array shown. Thus, the output signal from the active detecting element (left-hand side in FIGS. 1 and 3) may be extracted via a narrow conductor track 122 (for example of gold) which contacts the electrode 22 and extends to an expanded area 122a on an outer rim 31 of the mounting arrangement. These expanded areas 122a form bond pads to which wire connections 127 can be made to connect each active detecting element 20 to a gate of a respective field-effect transistor in the readout circuit (see FIG. 4). The detecting element and compensating element forming each pair are connected in series by a narrow conductor track 121 (for example of gold) which contacts the electrodes 21 of the pair of elements 20. The element portions of the pyroelectric film are polarized in the same direction in this case, and so the polarities of these two elements 20 connected in series are opposite. The electrodes 22 of the compensating elements 20 are connected by narrow conductor tracks 123 (for example of gold) to a common expanded area 123a which provides a bond pad for a common connection to the array. The tracks 121, 122 and 123 are carried on their respective faces of the film 10. Because, in each pair, the two detector elements are connected differentially. and to a single FET, immunity is provided from common mode signals such as those generated by variations in ambient temperature, background radiation and acoustic noise as both elements 20 respond equally and so generate equal and opposite signals which cancel to give no overall output signal. However, a scanned infrared image from a scene provides an output signal if it is arranged that the compensating elements receive less or no radiation 3 from the scene, for example by shielding the compensating element 20 or focussing the radiation 3 onto the active detecting element 20.

The film 10 can be given a desired tension P by stretching the film 10 slightly using a temporary mounting arrangement of two concentric rings to the outer of which the periphery of the film is secured. The inner ring is moved against the film 10 on the outer ring to apply the tension. The film 10 may be vibrated during this operation and its frequency of vibration (which increases with increasing tension P) may be monitored to indicate when the desired tension P has been achieved. When the film 10 mounted on the concentric rings has the desired tension P, a smaller annulus 31 which forms a component in the final detector assembly may be secured to the film 10 around the central array area of the film, and the remainder of the film may be severed to leave this array film area 10 mounted on the annulus 31.

In the form illustrated by way of example in FIG. 2, the annulus 31 is of rectangular outline. The annulus 31 is preferably made of a material having a coefficient of thermal expansion near to that of the film 10, and so it may be of moulded plastics material, for example polyvinylidene fluoride. The periphery of the film 10 may be bonded to the annulus 31 by, for example, epoxy adhesive.

The part of the mounting arrangement providing the supports 32 and cavities 35 may also be of moulded plastics material, for example polyvinylidene fluoride. Thus, the cavities 35 may be moulded in a substrate 30 having integral supports 32 which taper towards the film 10 to form a narrow smooth upper edge contacting the face 11 of the film 10 at areas beyond the first electrodes 21. In the form illustrated by way of example in FIG. 2, a single cavity 35 is present below each row of detector elements 2, and the tapering ridge portions forming the supports 32 extend longitudinally from the outer rim of the substrate 30 to provide a cellular support. Apertures 36 moulded through the substrate 30 extend into the cavities 35 to provide conduits 36 permitting ambient pressure inside each cavity 35 to equalize the ambient pressure at the opposite second face of the polymer film. In the modification illustrated in FIG. 4, cross ridge portions 32 are present between neighbouring detector elements 20 of each row, and all the ridges 32 together form a continuous cellular network around the cavities 35 each of which has its own conduit 36 (not shown for the detector element cavities 35 in the plan view). The film 10 may simply bear against the ridge supports 32, but is preferably (in order to restrain better the movement and flexing of the film 10)

secured to the ridge supports 32, for example by bonding with epoxy adhesive.

The substrate 30 may have, for example, an integral rim forming the member 31 to which the film 10 is bonded, or the substrate 30 may be a separate member from the annulus 31. The mounting arrangement as illustrated in FIG. 3 also comprises an apertured base 29 on which the substrate 30 and annulus 31 are secured. When the substrate 30 and the annulus 31 are two separate members in a concentric sliding arrangement, these two members may be used (instead of a temporary mounting arrangement of two concentric rings) to produce the desired tension P in the film 10. Thus, in this case, the film 10 is first secured to the annulus 31, and then the substrate 30 with its spaced supports 32 is moved against the film 10 in the concentric mounting arrangement 30 and 31 so as to stretch slightly the film 10 and produce the desired tension P, after which the substrate 30 is secured in that position inside the annulus 31 by, for example bonding with an adhesive.

By tapering the supports 32 to a narrow edge, thermal conduction to and from the film 10 through the substrate mount 30 is minimised while still providing a good overall support of the film in a manner which gives reliable control of the natural frequency of vibration of the film areas over the cavities 35. This thermal conduction can also be reduced by arranging that the areas at which the supports 32 contact the film 10 are separated from the electrodes 21 by at least a thermal-diffusion distance D for heat flow along the polymer film. The thermal diffusion distance D is related to the chopping frequency for radiation 3 incident on the detector, as will be described hereinafter. The frequency bandwidth of the detector is also chosen in accordance with the chopping frequency for the radiation 3.

Figure 5:
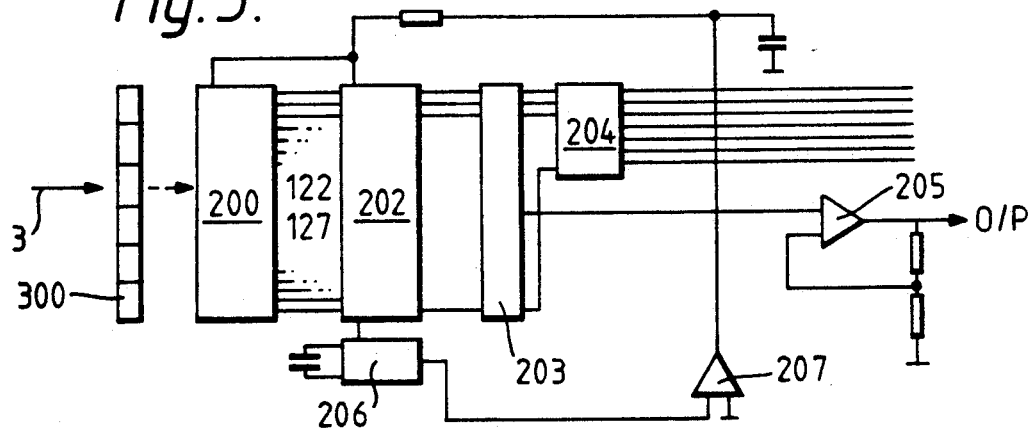
FIG. 5 is a block diagram illustrating the detector array and electronic read-out circuit of such a detector in accordance with the invention.

FIG. 5 illustrates an example of a read-out circuit of the detector, to which the array 200 of detector elements 20 is connected. The illustrated circuit corresponds to that shown in the article entitled "High resolution 64-element pyroelectric linear array IR detector" by A.A. Turnbull and M.E. Cooke published in SPIE (*Society of Photo Optical Instrumentation Engineers*, USA) Vol. 807, Passive Infrared Systems and Technology (1987), pages 92 to 97. The whole contents of this 1987 SPIE article are hereby incorporated herein as reference material. The outputs from the detector elements 20 are fed via individual connections 122, 127 to a circuit block 202 comprising field-effect transistors in a source-follower configuration and comprising opposed parallel diodes as shunt resistances at the input of each source follower. By coupling the electrodes 22 of the active detector elements (via the connections 122, 127) to the gate of their respective FETs, impedance matching is achieved in known manner. The circuit block 202 also comprises source loads from which outputs are fed individually to an amplifier 205 via a multiplexer 203 controlled by an address decoder 204. The signal output O/P of the detector is taken from the amplifier 205. The other blocks 206 and 207 serve for offset voltage compensation as described in said 1987 SPIE article. The highest operating frequency of this read circuit 202 and 205 defines the highest frequency fl in the bandwidth of the detector and is chosen in relation to the chopping frequency of the incident radiation 3.

Apart from mounting the detector film in accordance with the present invention, a thermal-imaging system in which the detector is used may comprise known components arranged in known manner, for example to form an infrared camera. Thus, the radiation 3 may be focussed on the detector elements 20 through an infrared optical system, normally comprising a lens system and possibly also comprising a scanner at least in the case of a linear array of detector elements 20. When the temperature of the pyroelectric film 10 changes locally owing to the absorption of thermal energy B from the imaged radiation 3, charges are developed at the opposed faces 11 and 12 of the affected regions of the film 10 and are detected via the electrodes 21 and 22. Since charge generation within the pyroelectric film 10 is dependent on temperature changes of the film, incident radiation 3 must vary with time in order that it is detected. For this purpose modulation means 300 (for example a mechanical chopper) is present in the system in front of the detector elements 20 for periodically modulating the transmission of thermal radiation 3 to the detector elements 20 thereby determining a transmission frequency f for the incidence of the radiation 3 on the detector elements 20. This chopper frequency f may be, for example 40 Hz.

The upper limit fl of the frequency bandwidth of the read-out circuit 202 to 205 is chosen so as to be able to process the signals from the detector elements 20 at this chopper frequency f and may typically be chosen in accordance with the expression:

$$f1 = 2f.N.A/2\pi \qquad (1)$$

where f is the chopper frequency in $s^{-1}$ (Hz)

N is the number of detector elements 20 being addressed, and

A is a safety factor to avoid signal distortion in the circuitry, and especially in the output from the amplifier 205.

With a linear array of 64 detector elements 20 to be addressed, and with a chopper frequency f of 40 Hz and safety factor A of 10, the value of fl is just above 8 kHz.

FIG. 2 illustrates an arrangement with elongate cellular cavities 35 having a length y which is much longer (for example nearly two orders of magnitude longer) than its width x. In this situation, the small distance x dominates in determining the natural frequency of vibration $v$ of the tensioned film 10, and this resonant frequency in its lowest mode of vibration can be represented by the following approximate expression:

$$v = (5P/2\rho)^{-\frac{1}{2}} . x^{-1} \qquad (2)$$

where $v$ is in $s^{-1}$ (Hz)

P is the tension in Pascals (Pa) applied to the film 10, $\rho$ is the density of the film material in $g.cm^{-3}$, and x is in cm.

With an applied tension P of $5 \times 10^4$ Pa on a film 10 with density $\rho$ of 1.78 $g.cm^{-3}$, the following values are obtained:

$v$ of 20 kHz for $\times$ of about 130 $\mu m$ $v$ of 15 kHz for $\times$ of about 200 $\mu m$ $v$ of 10 kHz for $\times$ of about 265 $\mu m$.

Figure 4:
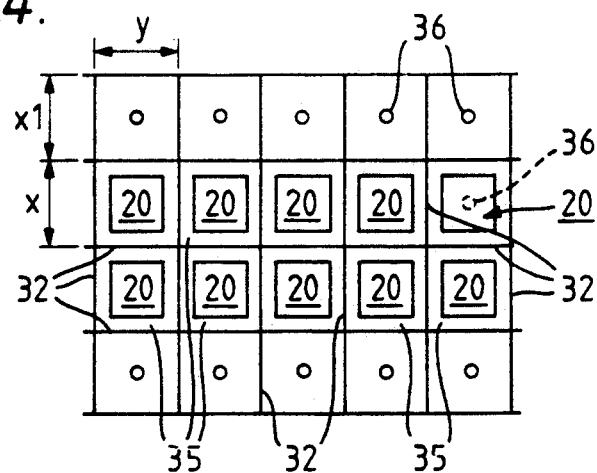
FIG. 4 is a schematic plan view of part of another form of array device of such a detector in accordance with the invention.

FIG. 4 illustrates an arrangement with square cellular cavities 35 (x=y) below each detector element 20. In this situation the equivalent approximate expression is $$v = (5P/\rho)^{-\frac{1}{2}} . x^{-1} \qquad (3)$$

With an applied tension P of $5 \times 10^4$ Pa and a film density $\rho$ of 1.78 g.cm$^{-3}$ the following values are obtained:

$\nu$ of 20 kHz for $\times$ (and y) of about 185 μm
$\nu$ of 15 kHz for $\times$ (and y) of about 280 μm
$\nu$ of 10 kHz for $\times$ (and y) of about 375 μm.

When the highest frequency fl in the detector bandwidth is just above 8 kHz (with a chopper frequency of 40 Hz) the tension P of the film 10 and the width $\times$ of the cavities 35 below the detector elements 20 (i.e. the spacing $\times$ of the corresponding supports 32) are chosen such that the natural frequency of vibration $\nu$ of these parts of the tensioned film 10 is 10 kHz or more, for example at least 15 kHz and preferably even 20 kHz. In this manner, electrical output generated piezoelectrically in the detector elements 20 at resonant frequencies of the film 10 does not contribute to the final electrical output O/P from the detector.

FIGS. 1 to 4 show additional cavities 35 which do not underlie detector elements 20 and which have a width of Xl. The width Xl may be chosen to be the same as $\times$ so as to provide a symmetrical support of the various parts of the film 10, both at and around the area of the detector elements 20 However, the width Xl may be chosen to be different, for example to be larger than the width $\times$ but preferably still smaller than the distance for which the natural frequency of vibration of that non-element part of the film 10 equals the highest frequency fl in the detector bandwidth.

The applicants have found that, with infrared detectors using pyroelectric flexible polymer films, the microphonic output at resonant frequency far exceeds that at non-resonant frequencies. Thus, the present invention provides a very significant advantage at resonance. However, with a sufficiently small spacing $\times$ of the supports 32 adjacent to the detector elements 20 and a sufficiently high tension P of the film 10 in accordance with the present invention, the microphonic output is reduced for all frequencies (non-resonant as well as resonant) at which the film 10 is forced to vibrate in the environment in which the detector is used. As the spacing $\times$ is reduced (for a given sufficient tension P), the amplitude of vibration of the parts of the film 10 between the supports 32 decreases, and the microphony from these vibrating piezoelectric film parts is reduced. In this vibrating set-up, several of the parameters are functions of the area of the vibrating parts, and hence of the spacing(s) $\times$ and y between the supports 32, i.e. the mass of the vibrating part decreases as the area decreases and so too does the deflection force on the vibrating part, whereas the restoring force per unit deflection increases as the area decreases, for a given film tension.

Because the transmission of the thermal-radiation 3 to the detector elements 20 is modulated by the chopper 1, there is a limiting distance herein termed the thermal diffusion distance D (the magnitude of which depends on the transmission frequency f) for heat flow along the film 10 from the detector elements 20. The concept of a thermal diffusion distance in a chopped pyroelectric infrared detector system is described in the article entitled "Calculation of Temperature Distribution and Temperature Noise in a Pyroelectric Detector - II Evacuated Tube" by R.M. Logan in Infrared Physics (1973) vol. 13, pages 91 to 98 published by Pergamon Press (Great Britain). The whole contents of this Infrared Physics article are hereby incorporated herein as reference material.

Because the variations in temperature of the detector elements 20 are pulsed by the chopper modulation, the heat flow along the film 10 from the detector elements 20 is also pulsed. Between these heat pulses the heat injected in this manner into the non-electroded areas of the film 10 diffuses by conduction along the film material at a rate dependent on the thermal conductivity K and volume specific heat c of the film material. Due to this diffusion between heat pulses, the parts of the film 10 which are further from the detector elements 20 than the thermal diffusion distance D (see FIG. 1) do not experience temperature variations due to the variations in temperature of the detector elements. An approximate expression for the thermal diffusion distance D in the film 10 at the transmission frequency f is given by equation (4):

$$D = K^{\frac{1}{2}} \cdot (\pi c f)^{-\frac{1}{2}} \quad (4)$$

where D is in cm.
K is in J.cm$^{-1}$.K$^{-1}$.s$^{-1}$
c is in J.cm$^{-3}$.K$^{-1}$
and f is in s$^{-1}$.(Hz).

In a specific example of a polyvinylidene fluoride having K of about $1.9 \times 10^{-3}$ J.cm$^{-1}$.K$^{-1}$.s$^{-1}$, and c of about 1.7 J.cm$^{-3}$ .K$^{-1}$., the value for D is about $1.88 \times 10^{-2}$(f)$^{-\frac{1}{2}}$. In this specific example, D is about 30 μm (micrometers) with a chopper frequency f of 40 Hz, about 60 μm with f of 10 Hz, and about 20 μm with f of 100 Hz.

Therefore in order to decouple the detector elements from varying heat flow to and from the tapered supports 32, the electrode 21 needs to be spaced by about 30 μm or more from the supports 32 for a chopper frequency of 40 Hz. Thus, for thermal reasons, the spacing between supports 32 having a detector element 20 therebetween is preferably at least (W +2 D) where W is the width of the electrode 21. In a typical example for a 64 element linear array, W may be about 100 μm, for example. Therefore in this case the spacing between supports 32 should be at least 160 μm, for thermal reasons. It can be seen that this value for the spacing can be made readily compatible with the value $\times$ already calculated for the spacing so as to give the film 10 a natural frequency of vibration $\nu$ higher than the bandwidth f0 to f1 of the detector. The choice of an appropriately increased tension P permits an increase in the spacing $\times$ in situations where such an increased spacing may be desirable for thermal reasons.

Figure 6:
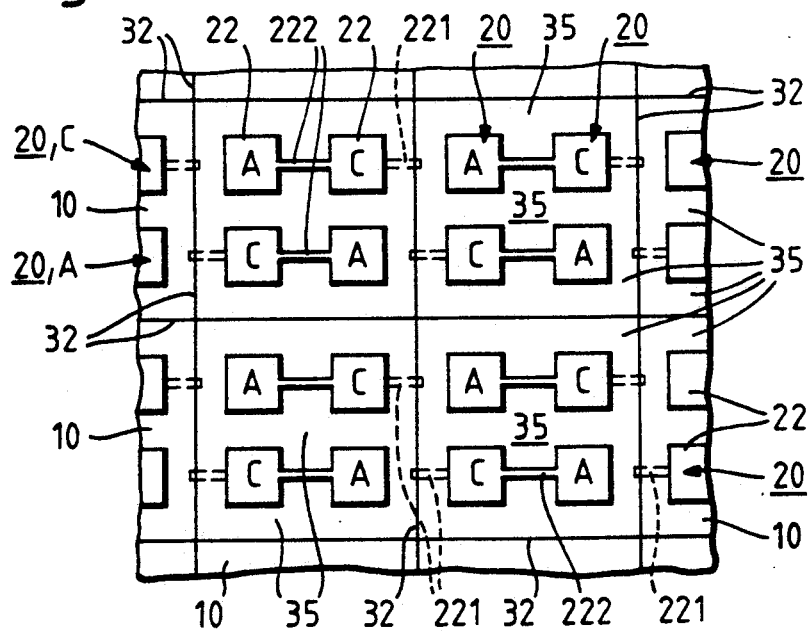
FIG. 6 is a schematic plan view of part of another form of array device of a thermal-radiation detector in accordance with the invention.

FIG. 4 illustrates a situation where the width $\times$ and length y of each cellular cavity is sufficient to accommodate only single detector elements 20. FIG. 2 illustrates a situation in which the length y of each cellular cavity is sufficient to accommodate a row of detector elements 20. FIG. 6 illustrates a further situation in which a plurality of detector elements 20 is mounted over each cavity. In this example, the spacings $\times$ and y between the tapered supports 32 are sufficient to accommodate four elements 20 over each cavity 35. These four elements 20 may all be active detector elements. However they may comprise active detecting elements A and passive compensating elements C, in which case it is preferable to arrange symmetrically the active elements A and compensating elements C over each cavity so as to provide symmetrical outputs for cancelling common-mode signals such as those generated by variations in ambient temperature etc.

A symmetrical arrangement of a group of active detector elements 20 (or of active detector elements and compensating elements) over each cavity 35 may be adopted for linear arrays. However, by way of example, FIG. 6 illustrates such a symmetrical arrangement for a two-dimensional array which may be mounted on, for example, a monolithic silicon integrated circuit comprising circuit blocks 202 to 204, for example. In this case, the cellular network of tapered ridges 32 for supporting the tensioned film 10 in accordance with the invention may be formed by patterning a polyimide or other polymer coating on the top surface of the integrated circuit which accordingly provides the base 30. The bottom active electrodes 21 of the active detector elements may be connected to input pads of the integrated circuit, by for example conductive rods similar to those described in published United Kingdom patent application GB-A-2 030 023 or by for example a conductive coating on insulating bumps (for example of the same polyimide or other polymer as the ridges 32) similar to those described in U.S. Pat. specification No. US-A-4 740 700. The whole contents of GB-A-2 030 023 and US-A-4 740 700 are hereby incorporated herein as reference material. When compensating elements C are also present in the symmetrical arrangement over each cavity 35, conductive tracks 222 may be present on the upper face 12 of the tensioned film to connect the upper electrodes 22 of the active and compensating elements in series, and short tracks 221 may be present on the lower surface 11 leading from the bottom electrode 21 of each compensating element C to a neighbouring tapered ridge 32. The upper edge of these ridges 32 may be metallized to form a common connection for the array.

With a complete cellular network of tapered ridges 32 on an integrated circuit surface, conduits 36 may pass through each of the ridges 32 to equalise the ambient pressure in inch cavity 35. In some situations, conduits 36 may be holes through the side-walls of the tapered ridges 32. However, the conduits 36 may be, for example discontinuities in the upper edge of the ridges 32. In one form, the ridges 32 may even be replaced by tapered bumps which are arranged so as to be distributed in a spaced pattern over the face 11 of the tensioned film 10. In this latter case of distributed spaced bumps, it is not easy to model mathematically the relationship between the spacing $\times$ of the bumps 36 and the frequency $\nu$ of the intermediate parts of the tensioned film 10, but a sufficiently high density of bumps 36 is adopted so that (with a sufficiently high tension P of the film 10) the frequency $\nu$ exceeds the frequency band-width (f0 to f1) of the detector.

With a 2-dimensional array of detector elements, the incident radiation 3 may be chopped and signals read out using equipment and circuitry of known types in a manner similar to that described in the said 1987 SPIE article or GB-A-2 030 023, for example. However, it is also possible to chop the radiation 3 at a much higher rate to reduce thermal diffusion along the film 10 (and so to reduce the thermal diffusion distance D) and for the read-out circuit to provide electronic integration or accumulation of the signals from the detector elements 20 in a manner similar to that described in U.S. Pat. specification No. US-A-4 072 863. In this case the high chopping frequency f may determine a higher upper limit f1 of the frequency bandwidth (f0 to f1) of the detector. The whole contents of US-A-4 072 863 are hereby incorporated herein as reference material.

As described in copending United Kingdom patent application GB-A-2217442 instead of each detector element 20 of a row having its own companion compensating element 20, the row may have simply one or two compensating elements 20 which can be arranged in the same row as the active detector elements and the output signals of which are suitably processed and used to provide temperature compensation for the active elements 20. Thus, the devices of FIGS. 1,2 and 3 may be modified to have only a single row of the elements 20. The whole contents of GB-A-2217442 are hereby incorporated herein as reference material.

Although specific embodiments have been described and shown in terms of arrays of detector elements 20, the present invention may be used to mount tensioned pyroelectric polymer films 10 providing a single detector element 20 or a pair of elements 20 in a so-called "dual" detector, for example with detector elements as described in EP-A-0 269 161.

It will be evident that many other modifications are possible within the scope of the present invention. Thus, for example, in order to produce infrared detector elements with low thermal mass, short response time, wide spectral response, and good sensitivity, there is considerable interest in the use of Langmuir-Blodgett films with ferroelectric and/or pyroelectric properties. Unlike conventional ferroelectric and/or pyroelectric materials, Langmuir-Blodgett films do not require poling. Published PCT application WO-A-87/00347 discloses particular examples of Langmuir-Blodgett films with pyroelectric and ferroelectric properties. The whole contents of WO-A-87/00347 are hereby incorporated herein as reference material. In these cases, the optical thickness of the films is much smaller than a quarter of a wavelength in the wavelength range being detected. Thus, for example, in typical cases the Langmuir-Blodgett films may have a physical thickness of between 0.05 $\mu$m and 0.5 $\mu$m, and so their optical thickness may he an order of magnitude thinner than the pyroelectric polymer films in EP-A-0 269 161.

The present inventor has discovered that in spite of being much thinner, good infrared absorption can still be achieved with a Langmuir-Blodgett pyroelectric film 10 by giving both the electrodes 21 and 22 a high resistance and mounting the tensioned film 10 in a support arrangement 30,31,32 having a reflective surface on the substrate 30 facing the bottom resistive electrode 21 across a gap 35 of optimised dimensions. The Langmuir-Blodgett film 10 may be present on a support layer either at its front or back face and can be tensioned by tensioning the support layer. Because these Langmuir-Blodgett films also have piezoelectric properties, it is advantageous to mount them in accordance with the present invention on spaced supports 32 protruding from the reflective substrate 30 and having a spacing $\times$ sufficiently small that the resonant frequency $\nu$ of the parts of the tensioned film 10 between neighbouring supports 32 is higher than the frequency band-width f0 to f1 of the detector.

Many other modifications and variations are possible within the scope of the present invention. In most applications of the invention, the material of the film 10 and the design and circuit operation of the detector elements 20 are likely to be chosen so as to utilize the conventional pyroelectric effect in which when a temperature change occurs (for example upon absorption of incident infrared radiation 3 of a thermal image) in a polar crystalline (structured) material exhibiting spontaneous polarization, the material generates electric charges at its opposite faces. By arranging the pyroelectric material in known manner as a capacitor (with electrode connections 21 and 22 at the opposite faces) in a suitable amplifying circuit, a current or voltage signal can be developed and detected. Most of the useful pyroelectric materials are also ferroelectric and exhibit their pyroelectric properties in the ferroelectric phase below their Curie point transition temperature. However, infrared detectors may also be constructed in known manner using ferroelectric materials operating in the region of their Curie point where their dielectric constant changes rapidly with temperature. Such ferroelectric infrared detector elements may also be constructed as capacitors with electrode connections 21 and 22 at opposite faces. These ferroelectric types of detector elements 20 can be formed in a tensioned film 10 and mounted on spaced supports 32 to increase the resonant frequency u of the film parts to above the detector bandwidth f0 to f1, in accordance with the present invention.

From reading the present disclosure, other variations will be apparent to persons skilled in the art. Such variations may involve other features which are already known in the design, manufacture and use of vibrational arrangements and piezoelectric devices, and of thermal-radiation detection systems and devices, groups of infrared detector elements of ferroelectric and/or pyroelectric material, and component parts thereof, and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A thermal-radiation detector comprising:
    a flexible continuous film of polymer material having a temperature-dependent electrical characteristic and piezoelectric properties,
    first and second electrodes at respective first and second opposite faces of the film to form at least one infrared detector element with the polymer material having said temperature-dependent characteristic,
    a mounting arrangement comprising a plurality of mutually-spaced supports on which the film is mounted so as to by self-supporting between adjacent supports, the supports being spaced out over the whole of the first face on the film so fast to provide support both around a peripheral area of the film and over a non-peripheral area of the film and to provide cavities between the spaced supports such that where the at least one detector element is present at least most of the area of said first face of the polymer film is free of contact with the mounting arrangement,
    the film being held under tension with at least its peripheral area secured to the mounting arrangement, and
    the spacing between adjacent supports in a non-peripheral area proximate to the at least one detector element being sufficiently small and the tension of the film being sufficiently large that the natural frequency of vibration of the self-supporting part of the film between these neighbouring supports is higher than the frequency bandwidth of the detector.

2. A detector as claimed in claim 1, further characterised in that the at least one element comprises a group of individual first electrodes at said first face of the polymer film, the first electrodes are located over the cavities, and the supports contact said first face of the polymer film at areas between the first electrodes.

3. A detector as claimed in claim 2, further characterised in that a plurality of the at least one detector element is mounted over each cavity.

4. A detector claimed in claim 3, further characterised in that the plurality of detector elements comprise active detecting elements and passive compensating elements, the detecting elements and compensating elements over each cavity being arranged symmetrically.

5. A detector as claimed in claim 4 further characterised in that the areas at which the supports contact the first face are separated from the at least one detector element by at least a thermal-diffusion distance for heat flow along the polymer film.

6. A detector as claimed in claim 1 further characterised in that at least the part of the mounting arrangement providing the supports and cavities is of plastics material.

7. A detector as claimed in claim 6, further characterised in that both the film of polymer material and said molded plastics material of the mounting arrangement comprise polyvinylidene fluoride.

8. A detector as claimed in claim 1, further characterised in that the supports taper towards the polymer film to form a narrow upper edge which contacts said first face of the polymer film.

9. A detector as claimed in claim 8, further characterised in that tapering ridge portions of a mount extend between neighbouring cavities in the mount to form the mutually-spaced supports.

10. A detector as claimed in claim 9, further characterised in that the ridge portions form a continuous network around the cavities.

11. A detector as claimed in claim 1 further characterised in that apertures extend through the mounting arrangement and into the cavities to provide a conduit permitting ambient pressure inside each cavity to equalize the ambient pressure at the opposite face of the polymer film.

12. A detector as claimed in claim 1, further characterised by an electronic read-out circuit to which the at least one detector element is for reading out signals from the at least one detector element and in that the highest operating frequency of the read-out circuit defines the highest frequency in said frequency bandwidth of the detector.

* * * * *